United States Patent
Cruz et al.

(10) Patent No.: US 7,402,893 B2
(45) Date of Patent: Jul. 22, 2008

(54) SYSTEM AND METHOD FOR IMPROVED AUTO-BOATING

(75) Inventors: Mark Gerald M. Cruz, Baguio (PH); Jerry G. Cayabyab, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 870 days.

(21) Appl. No.: 10/719,616

(22) Filed: Nov. 21, 2003

(65) Prior Publication Data

US 2005/0110122 A1    May 26, 2005

(51) Int. Cl.
*H01L 23/552* (2006.01)
(52) U.S. Cl. .......................... 257/660; 257/98; 257/99; 438/106
(58) Field of Classification Search ................. 438/106; 29/592.1, 825–846; 257/678–787, 98, 99, 257/660
See application file for complete search history.

(56) References Cited

U.S. PATENT DOCUMENTS 6,111,324 A * 8/2000 Sheppard et al. ............ 257/787

2002/0093080 A1 * 7/2002 Kay ........................... 257/678

* cited by examiner

*Primary Examiner*—Walter Lindsay, Jr.
*Assistant Examiner*—Abdulfattah Mustapha
(74) *Attorney, Agent, or Firm*—Tum Thach; Wade James Brady, III; Frederick J. Telecky, Jr.

(57) ABSTRACT

According to one embodiment of the invention, a system used in auto-boating includes a tape substrate supported by a boat. The tape substrate includes a pair of lateral edges parallel to one another and each having respective first and second ends, and a pair of longitudinal guide strips parallel to one another. One of the longitudinal guide strips extends between the respective first ends of the pair of lateral edges and the other longitudinal guide strip extends between the respective second ends of the pair of lateral edges. The tape substrate also includes a plurality of die attach regions disposed within the area defined by the pair of lateral edges and the pair of longitudinal guide strips. The system further includes a boat clip coupled to the boat such that the tape substrate is sandwiched between the boat and the boat clip. Each longitudinal guide strip includes a pair of tabs disposed at opposite ends thereof such that each tab extends beyond a respective one of the lateral edges.

8 Claims, 2 Drawing Sheets

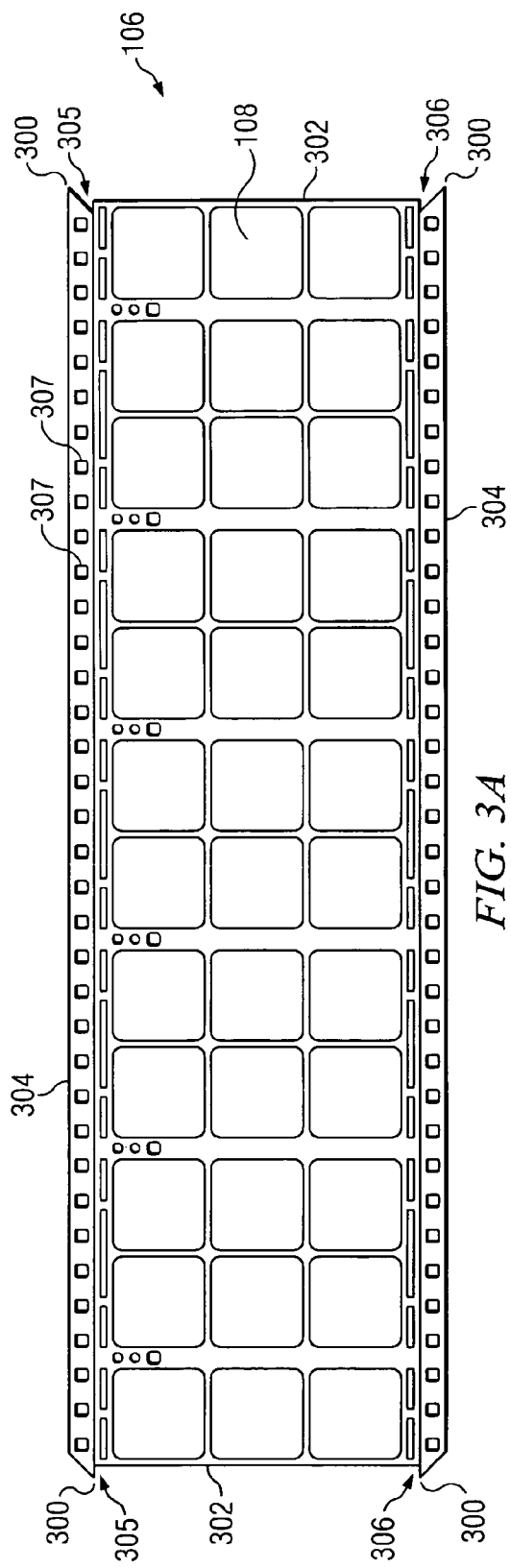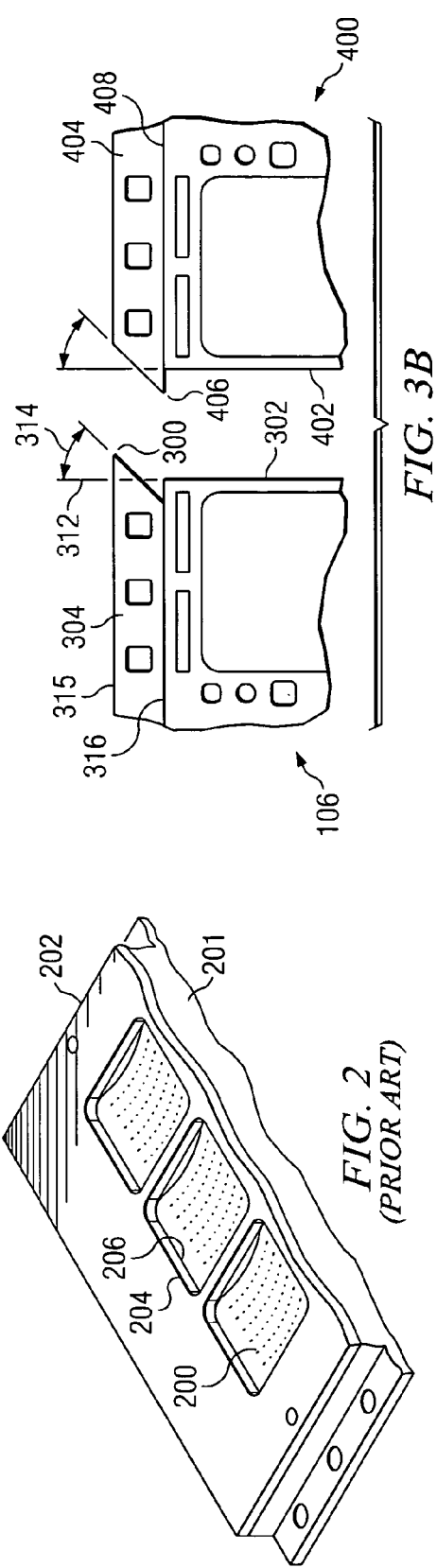
FIG. 3A
FIG. 3B
FIG. 2
(PRIOR ART)

United States Patent US 7,402,893 B2

SYSTEM AND METHOD FOR IMPROVED AUTO-BOATING

TECHNICAL FIELD OF THE INVENTION

This invention relates generally to the field of integrated circuit packaging and, more specifically, to a system and method for improved auto-boating.

BACKGROUND OF THE INVENTION

Because of the sheer volume of integrated circuits in the marketplace, packaging of integrated circuits in a manner that is cost-effective with high yield is important for semiconductor manufacturers in order that they can be competitive in the marketplace. One important process in the fabrication of integrated circuits is the die attach process. Because of the ever decreasing thickness of some substrates, such as tape substrates, the die attach process becomes even more important because of the challenges present when attaching die to these types of substrates.

The auto-boating process, which sandwiches a tape substrate between a boat and a clip, greatly enhances the die attach process for tape substrates. However, since the clip holds down only a very small strip of the substrate along its edges, the possibility of the substrate edges getting jammed with the clip windows at the ends of the clip is high because of the coiling effect when placing a tape substrate on a boat. This leads to substrate bowing and warping along its edges, which means that the integrated circuit dies formed along the edges of the tape substrate may have to be scrapped, which hurts yield.

SUMMARY OF THE INVENTION

According to one embodiment of the invention, a system used in auto-boating includes a tape substrate supported by a boat. The tape substrate includes a pair of lateral edges parallel to one another and each having respective first and second ends, and a pair of longitudinal guide strips parallel to one another. One of the longitudinal guide strips extends between the respective first ends of the pair of lateral edges and the other longitudinal guide strip extends between the respective second ends of the pair of lateral edges. The tape substrate also includes a plurality of die attach regions disposed within the area defined by the pair of lateral edges and the pair of longitudinal guide strips. The system further includes a boat clip coupled to the boat such that the tape substrate is sandwiched between the boat and the boat clip. Each longitudinal guide strip includes a pair of tabs disposed at opposite ends thereof such that each tab extends beyond a respective one of the lateral edges.

Some embodiments of the invention provide numerous technical advantages. Other embodiments may realize some, none, or all of these advantages. For example, protrusions at the four corners of a tape substrate create small extensions at the edges of the tape substrate, which substantially eliminates the possibility of contact between the edges of the tape substrate and the clip windows. Hence, the tape substrate slides in place when the clip is pushed downward onto the tape substrate and any bowing/warping along the edges of the tape substrate is eliminated. These protrusions may easily be fabricated onto the edges of the tape substrate without having to change the length of the tape from which tape substrates are formed.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 2 illustrates the bowing of a prior art tape substrate being sandwiched between a boat and a clip; and FIGS. 3A and 3B are plan views of a tape substrate according to one embodiment of the present invention.

DETAILED DESCRIPTION OF EXAMPLE EMBODIMENTS OF THE INVENTION

Figure 1:
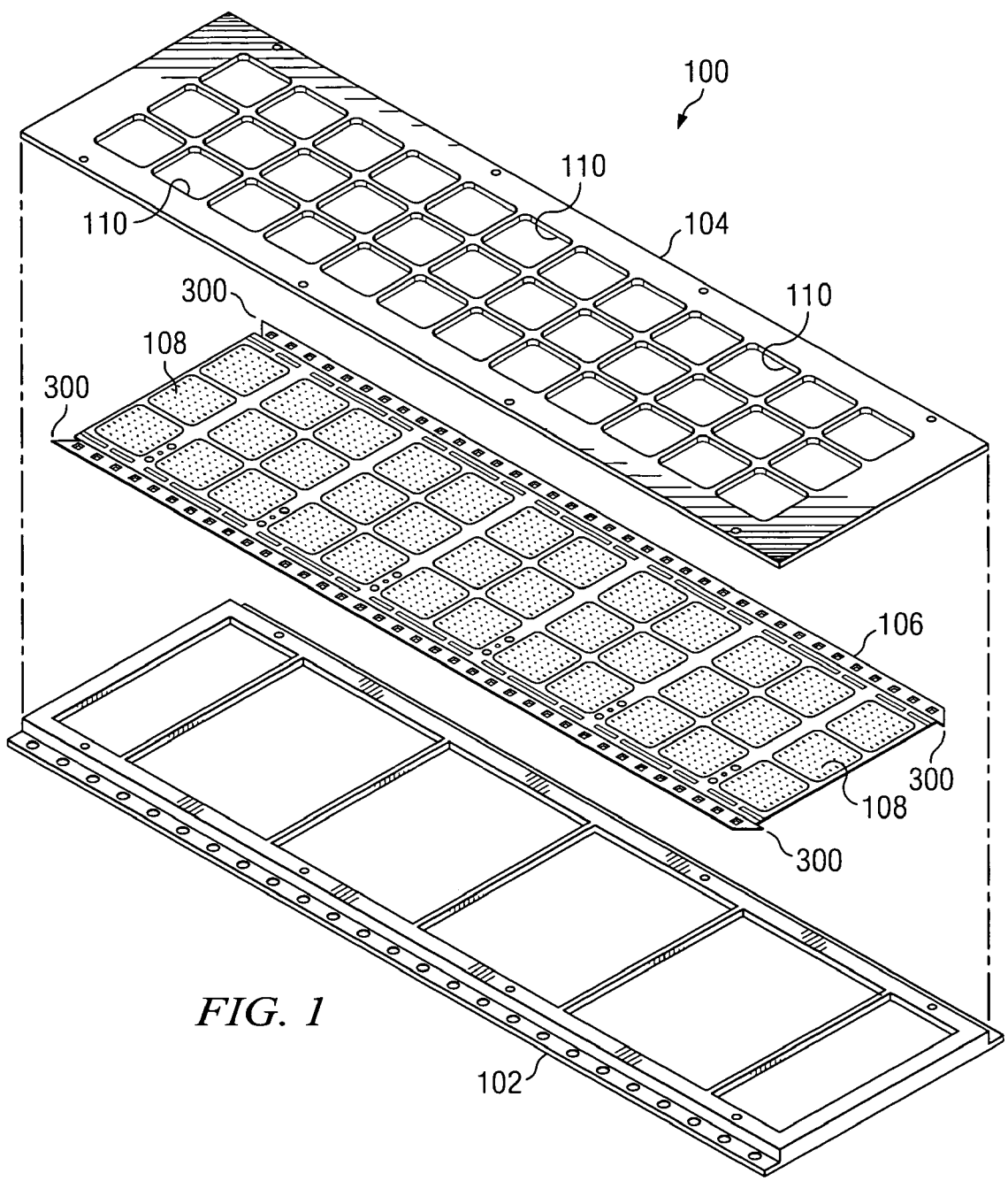
FIG. 1 is an exploded perspective view of a boat and a clip sandwiching a tape substrate according to one embodiment of the present invention.

Example embodiments of the present invention and their advantages are best understood by referring now to FIGS. 1 through 3B of the drawings, in which like numerals refer to like parts.

FIG. 1 is an exploded, perspective view of a system 100 utilized in an auto-boating process according to one embodiment of the present invention. The auto-boating process is well known in the integrated circuit fabrication industry. Hence, all details of such a process may not be fully described herein. Generally, system 100 is utilized in the fabrication of integrated circuits, such as ball grid arrays ("BGAs"). In the illustrated embodiment, system 100 includes a boat 102, a boat clip 104, and a tape substrate 106 disposed therebetween. Tape substrate 106 has a plurality of die attach regions 108 in which integrated circuit die are coupled thereto in order to fabricate individual integrated circuits.

Generally, boat 102 is used as a carrier for tape substrate 106 during the fabrication of integrated circuits and boat clip 104 secures tape substrate 106 to boat 102. Boat clip 104 facilitates the die attach process for tape substrate 106 by including a plurality of windows 110 formed therein that expose die attach regions 108 on tape substrate 106. Both boat 102 and boat clip 104 may be formed from any suitable material; however, boat 102 and boat clip 104 are typically formed from a suitable metal.

Because tape substrate 106 is typically very thin, boat 102 and boat clip 104 are needed to secure tape substrate 106 in place so that integrated circuit die may be attached to tape substrate 106 in an accurate and cost-efficient manner. As a brief example of the fabrication process for integrated circuits utilizing system 100, integrated circuit die (not shown) are attached to respective die attach regions 108 on tape substrate 106, a suitable wire bonding process couples the integrated circuit die to the appropriate contacts on each die attach region 108, and then tape substrate 106 is transferred to the next assembly station so that a suitable encapsulation process may take place. After encapsulation, a suitable ball attach process is utilized to attach solder balls to the underside of a tape substrate 106 before the integrated circuits are singulated with a suitable singulation process.

Since tape substrate 106 receives integrated circuit die, it is important for die attach regions 108 of tape substrate 106 to be relatively planar without any bowing or warping before the integrated circuit die are attached thereto. Bowing and warping problems of die attach regions 108 proximate each end of tape substrate 106 have been discovered using prior auto boating systems. An example of such substrate bowing is illustrated in FIG. 2.

Referring to FIG. 2, the bowing of prior art tape substrate 200 is illustrated. Tape substrate 200 is sandwiched between a boat 201 and a boat clip 202. Typically, the bowing problem occurs because a lateral edge 206 of tape substrate 200 contacts the edges of clip windows 204 formed in boat clip 202 as boat clip 202 is positioned over substrate 200 during the coupling of boat clip 202 to boat 201 that is supporting tape substrate 200. This is because after tape substrate 200 is placed on boat 201, tape substrate 200 is not totally flat and "coils" upward along its longitudinal edges to form a somewhat concave surface. As boat clip 202 is placed on top of tape substrate 200 in order to sandwich tape substrate 200 between boat 201 and boat clip 202, the possibility of lateral edge 206 getting jammed with clip windows 204 is very high. The present invention addresses this problem by providing, in one embodiment, tape substrate 106 with a plurality of tabs 300 at each of its four corners, as described in more detail below in conjunction with FIGS. 3A and 3B.

FIGS. 3A and 3B are plan views of tape substrate 106 according to one embodiment of the present invention. In embodiment illustrated in FIG. 3A, tape substrate 106 includes thirty-six die attach regions 108 aligned in three rows and twelve columns; however, any suitable number of die attach regions 108 may be associated with tape substrate 106 and they may be arranged in any suitable pattern. Typically, tape substrate 106 is formed from polyimide; however, other suitable materials may also be utilized for tape substrate 106. Tape substrate 106 is typically cut from a larger tape substrate strip and, therefore, includes a pair of lateral edges 302 that are parallel to one another. Tape substrate 106 also includes a pair a longitudinal guide strips 304 that are parallel to one another and extend between respective first ends 305 and second ends 306 of lateral edges 302. Longitudinal guide strips typically include a plurality of apertures 307 formed therein to function as guides for tape substrate 106.

According to the teachings of one embodiment of the invention, each longitudinal guide strip 304 includes a pair of tabs 300 exposed at opposite ends thereof. As described briefly above, tabs 300 function to prevent substrate bowing and/or warping at the ends of tape substrate 106 when boat clip 104 is placed over tape substrate 106 and coupled to boat 102. Typically, the coupling of boat clip 104 to boat 102 is magnetic coupling; however, other suitable coupling methods may also be utilized. Tabs 300 facilitate the prevention of substrate bowing by acting as guides for each lateral edge 302 of tape substrate 106, thereby substantially eliminating the possibility of contact between lateral edges 302 and clip windows 110. Tape substrate 106 essentially slides in place when boat clip 104 is pushed downwards onto boat 102 without encountering bowing and/or warping of tape substrate 106.

Referring to FIG. 3B, one of the tabs 300 at one end of one of the longitudinal guide strips 304 is illustrated. As illustrated, tab 300 extends beyond a respective plane (denoted by reference number 312) that is perpendicular to tape substrate 106 and that contains a respective lateral edge 302 of tape substrate 106. Although tab 300 may have any suitable shape, in one embodiment, tab 300 is triangularly shaped. In an embodiment where tab 300 is triangularly shaped, tab 300 may be oriented at an angle 314 respect to lateral edge 302 of between approximately 30 degrees and 60 degrees. In a particular embodiment, tab 300 may be oriented at an angle 314 of approximately 45 degrees. Because of the nature of how tape substrate 106 is typically formed, tabs 300 generally lie in the same plane as tape substrate 106.

Although tab 300 is illustrated in FIG. 3B as being proximate an outer edge 315 of longitudinal guide strip 304, tab 300 may also be proximate an inner edge 316 of longitudinal guide strip 304 depending on its location on tape substrate 106. For example, also illustrated in FIG. 3B is a tape substrate 400 having a lateral edge 402, a longitudinal guide strip 404, and a tab 406 that is disposed proximate an inner edge 408 of longitudinal guide strip 404. As described above, tape substrate 106 may be a smaller portion of a larger tape substrate strip formed by cutting the longer tape substrate strip laterally into individual tape substrates. FIG. 3B illustrates one embodiment of cutting the longer tape substrate strip into two separate tape substrates (106 and 400). Therefore, when the longer tape substrate strip is cut, lateral edges 302 and 402 are formed in addition to tabs 300 and 406, which in the illustrated embodiment are cut at approximately 45 degree angles with respect to lateral edges 302 and 402. This not only creates the desirable tabs 300 and 406, but allows the tape substrate manufacturer to avoid having to lengthen the tape substrate strip that tape substrates 106 and 400 are formed from.

The result of cutting the longer tape substrate strip into separate tape substrates is illustrated best in FIG. 3A where tabs 300 on the left lateral edge 302 are proximate inside edge 316 of longitudinal strip 304 and tabs 300 on the right lateral edge 302 are proximate outer edge 315 of longitudinal guide strips 304. Again, other suitable methods may be utilized to form tabs 300 and, in some embodiments, tabs 300 may be separate components that are coupled to longitudinal guide strips 304. However, because of the nature of the fabrication of tape substrates, tabs 300 generally are integral with longitudinal guide strips 304.

Thus, in operation of one embodiment of the invention, and with reference to FIG. 1, tape substrate 106 is placed on boat 102. Because of the nature of the thickness and type of material that tape substrate 106 is formed from, a slight coiling effect results when tape substrate 106 is disposed on boat 102. Boat clip 104 is then pushed downwards onto tape substrate 106 and magnetically coupled to boat 102 to secure tape substrate 106 therebetween. As boat clip 104 starts to engage tape substrate 106, it first contacts longitudinal guide strips 304 and corresponding tabs 300, which act as guides for lateral edges 302 of tape substrate 106 to eliminate the possibility of contact between lateral edge 302 and clip windows 110 to prevent substrate bowing and/or warping. Integrated circuit die may then be attached to die attach regions 108 and tape substrate 106 without having to worry about any bowing and/or warping that affects the quality/reliability of the completed integrated circuits.

Although embodiments of the invention and their advantages are described in detail, a person skilled in the art could make various alterations, additions, and omissions without departing from the spirit and scope of the present invention, as defined by the appended claims.

What is claimed is:
1. A system used in auto-boating, comprising:
a boat;
a tape substrate supported by the boat, the tape substrate comprising:
a pair of lateral edges parallel to one another, each lateral edge having respective first and second ends;
a pair of longitudinal guide strips parallel to one another, one of the longitudinal guide strips extending between the respective first ends of the pair of lateral edges and the other longitudinal guide strip extending between the respective second ends of the pair of lateral edges; and
a plurality of die attach regions disposed within the area defined by the pair of lateral edges and the pair of longitudinal guide strips;

a boat clip having a plurality of windows coupled to the boat such that the tape substrate is sandwiched between the boat and the boat clip; and wherein each longitudinal guide strip comprises a pair of tabs disposed at opposite ends thereof such that each tab extends beyond a respective one of the lateral edges to prevent tape substrate from bowing.

2. The system of claim 1, wherein the tabs are triangularly shaped.

3. The system of claim 2, wherein the tabs are oriented at an angle of between approximately thirty degrees and sixty degrees with respect to the respective lateral edge.

4. The system of claim 2, wherein the tabs are oriented at an angle of approximately forty-five degrees with respect to the respective lateral edge.

5. The system of claim 1, wherein the tabs lie in the same plane as the tape substrate.

6. The system of claim 1, wherein the tape substrate is formed from polyimide.

7. The system of claim 1, wherein the tabs are formed integral with the longitudinal guide strips.

8. The system of claim 1, wherein the boat clip is magnetically coupled to the boat.

* * * * *